United States Patent
Yadavalli et al.

(10) Patent No.: US 6,973,422 B1
(45) Date of Patent: Dec. 6, 2005

(54) METHOD AND APPARATUS FOR MODELING AND CIRCUITS WITH ASYNCHRONOUS BEHAVIOR

(75) Inventors: Sitaram Yadavalli, San Jose, CA (US); Sandip Kundu, Cupertino, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/531,910

(22) Filed: Mar. 20, 2000

(51) Int. Cl.[7] ............................................. G06F 17/50
(52) U.S. Cl. ..................... 703/19; 703/13; 703/14; 703/15; 713/401; 714/33
(58) Field of Search ................ 703/13, 14, 15, 703/19; 713/401; 714/33

(56) References Cited

U.S. PATENT DOCUMENTS

| | | | |
|---|---|---|---|
| 5,649,176 A * | 7/1997 | Selvidge et al. ............ 713/400 |
| 5,798,645 A * | 8/1998 | Zeiner et al. ................. 703/15 |
| 5,938,785 A * | 8/1999 | Dargelas ..................... 714/744 |
| 6,295,636 B1 * | 9/2001 | Dupenloup ................... 716/18 |
| 6,370,493 B1 * | 4/2002 | Knapp et al. ................. 703/14 |

OTHER PUBLICATIONS

Bryant, "Extraction of Gate Level Models from Transistor Circuits by Four-Valued Symbolic Analysis", ICCAD-91, Digest of Technical Papers, 1991 IEEE International Conference on Computer-Aided Design, Nov. 1991, pp. 350-353.*

* cited by examiner

*Primary Examiner*—Jean R. Homere
*Assistant Examiner*—Herng-der Day
(74) *Attorney, Agent, or Firm*—Paul E. Steiner

(57) ABSTRACT

A netlist model of a physical circuit is provided. The netlist model includes a virtual delay element, wherein the virtual delay element is coupled to an asynchronous circuit element.

18 Claims, 7 Drawing Sheets

$in_{24} = L_1$ and $L_2$
$out_{24}$ = if (vclk1 == HIGH) then $in_{24}$//change state
    else $out_{24}$//retain state
B = $out_{24}$
C = A or B
$in_{26}$ = C
$out_{26}$ = if(vclk2 == high) then $in_{26}$//change state
    else $out_{26}$//retain state
A = $L_3$ and $out_{26}$

---

```
module fig1 (L1, L2, L3, vclk1, vclk2, .. )
input L1, L2, L3, vclk1, vclk2;

and     g14 ( in24, L1, L2 );
    vdelement g24 ( out24, vclk1, in24 );
    or      g16 ( in26, A, out24 );
    vdelement g26 ( out26, vclk2, in26 );
    and     g20 ( A, L3, out26 );

endmodule primitive vdelement (out, vclk, in)
output out;
reg out;
input vclk, in;

table
// vclk  data   out    out_new
    1     1:     ?      :1;
    1     0:     ?      :0;
    0     ?:     ?      :-;// - means 'no change', i.e. retain previous value
endtable
endprimitive
```

FIG. 3B

METHOD AND APPARATUS FOR MODELING AND CIRCUITS WITH ASYNCHRONOUS BEHAVIOR

BACKGROUND OF THE INVENTION

1. Field of the Invention

The present invention relates generally to modeling a logic gate level circuit. More particularly, the present invention relates to modeling the netlist modeling and a method of using sequential automatic test pattern generation for an asynchronous circuit to allow accurate testing.

2. Background of the Invention

Digital circuits typically undergo extensive operability testing. The testing is required because the presence of even one defective gate or transistor can ruin the reliability or even the functionality of a semiconductor chip. As chip speeds increase, circuits become more and more complex, therefore, it is often not practical and sometimes impossible to apply all possible tests to a chip.

Automatic test pattern generation (ATPG) is a computer implemented tool that is used to analyze complex integrated circuits such as combinational and synchronous sequential circuits. After a logic gate level description of the circuit (sometimes referred to as a netlist) is input to the computer, the ATPG then generates test patterns that are applied physically to the actual circuit by production testers. The test patterns are designed to reliably detect defects in the chip while applying the minimum number of tests. A good set of test patterns will be able to cover at least 90% of the chip.

FIG. 1 is a logic gate level diagram of a digital circuit 1 with a feedback loop and a logic gate level netlist model 2 representing digital circuit 1. Digital circuit 1 includes an AND gate 4 having a number of inputs. One input of an OR gate 6 is coupled to an output of AND gate 4 by a first conductive path 8. An output of OR gate 6 is coupled to one input of an AND gate 10 by a second conductive path 12, which is of greater length than first conductive path 8. An output of AND gate 10 is coupled to an input of OR gate 6.

Each equation in netlist model 2 represents a relationship between each gate in digital circuit 1. For example, C=A OR B represents the operation of OR gate 6. Netlist model 2 may be used by ATPG to simulate digital circuit 1, however it does not provide ATPG with any information regarding delays that may exist in digital circuit 1. Delays in circuits may be caused by varying factors including die and chip architecture constraints, the operational speed of each gate, the lengths of conductive paths between circuit elements, and the specific routing directions and positions of each element.

For example, in digital circuit 1, if second conductive path 12 is of much greater length than first conductive path 8, then a delay may be caused in the feedback loop. If the output of AND gate 10 is delayed, then the value of A may not have been updated when a new value for B arrives at OR gate 6. In another example, it is assumed that second conductive path 12 is much shorter than first conductive path 8 and AND gate 10 has a shorter delay than AND gate 4. In such a scenario, the output of AND gate 4 may be delayed so much that OR gate 6 operates on a new value of AND gate 10 and an old value of AND gate 4. This is known as a min-delay problem. Because there is a race between values of A and B to be input into OR gate 6, a race resolution mechanism must be used to correctly analyze and describe the operation of digital circuit 1.

However, in purely cycle based simulators or synchronous sequential ATPG systems, a mechanism for timing based race resolution is not available. ATPG systems do not have a concept of time beyond clock cycle pulses, therefore it is unable to resolve races between combination elements. Instead, ATPG tools rely on specific assumptions to perform race resolution between clock and data signals on latches or for delays in a combinational feedback loop. Because these assumptions are hard-coded in the software, the ATPG race resolution mechanism cannot be altered or redefined by the user. Therefore, using a test pattern generated by ATPG to test circuits with asynchronous behavior (including circuits that have time-borrowing or wave pipelining characteristics) will result in errors.

For example, if ATPG were used to generate test patterns for digital circuit 1, errors in testing would occur because there is no race resolution mechanism for OR gate 6. Not only would ATPG assume that one signal is arriving right after the other signal, it would also assume that the order in which signals arrive at OR gate 6 is arbitrary. Therefore, a test pattern generated by ATPG for digital circuit 1 would lead to errors in testing. In view of the foregoing, it is desirable to have a method and apparatus for modeling delays within a netlist or other circuit model to allow ATPG to generate a test pattern that is able to perform race resolution on circuits that exhibit asynchronous behavior either individually or collectively with other circuit elements.

SUMMARY OF THE INVENTION

In one embodiment of the present invention, a netlist model of a physical circuit is provided. The netlist model includes a virtual delay element, wherein the virtual delay element is coupled to an asynchronous circuit element.

BRIEF DESCRIPTION OF THE DRAWINGS

The present invention will be readily understood by the following detailed description in conjunction with the accompanying drawings. To facilitate this description, like reference numerals designate like structural elements.

FIG. 3B illustrates a logic gate level netlist model and a Verilog netlist representing model digital circuit illustrated in FIG. 3A.

DETAILED DESCRIPTION

A method and apparatus for netlist modeling for ATPG in circuits with asynchronous behavior. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
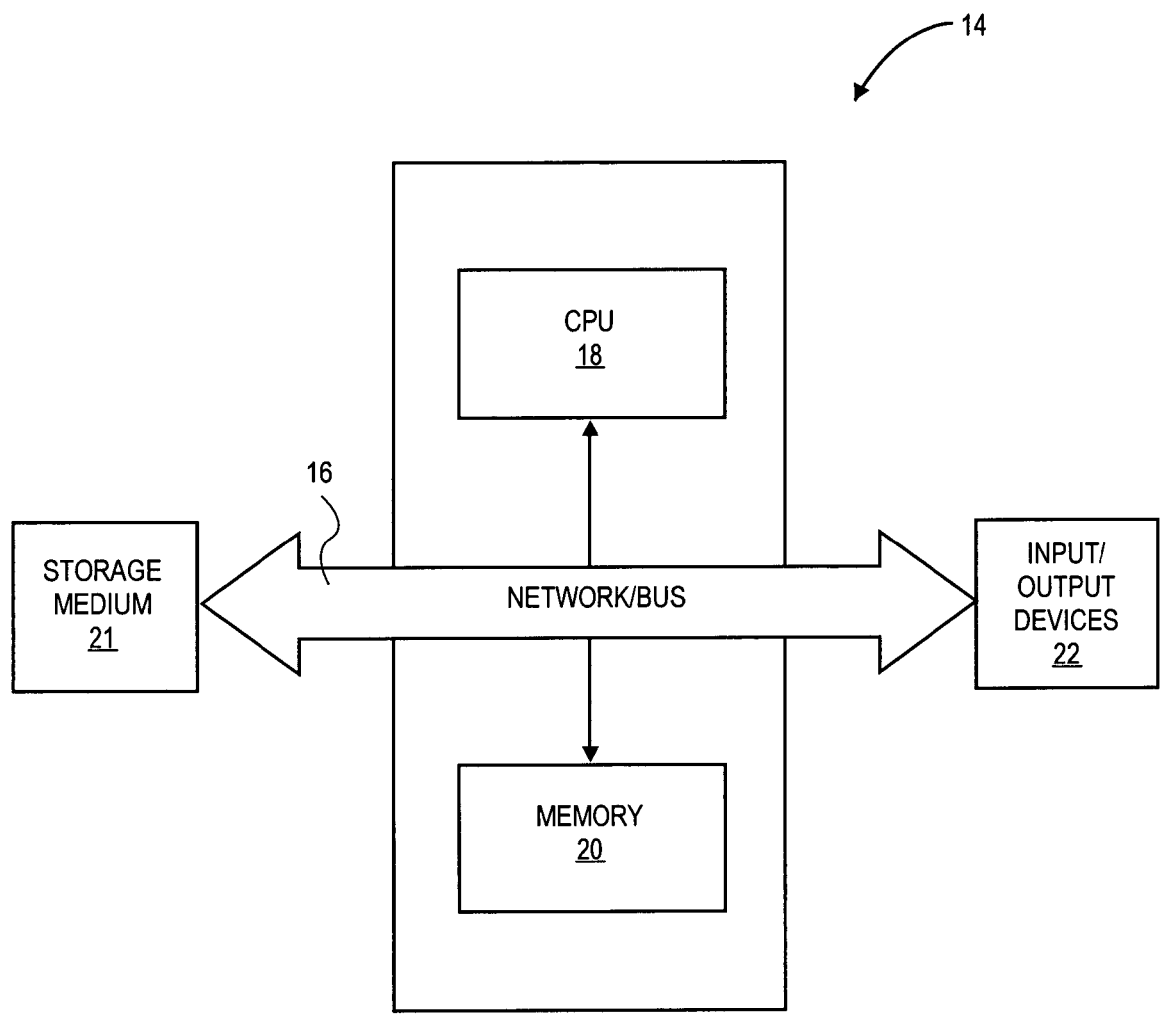
FIG. 2 is a block diagram of a computer system for generating a model digital circuit in accordance with one embodiment of the present invention.

FIG. 2 is a block diagram of a computer system 14 for generating a model digital circuit in accordance with one embodiment of the present invention. Computer system 14 includes a network or bus 16, which is coupled to a central processing unit (CPU) 18 and a memory unit 20. Network 16 is also coupled to a storage medium 21 and a number of input/output (I/O) devices 22.

Data is transferred along network 16 to and from each of the other components in computer system 14. Data representing a physical circuit to be tested is input by I/O devices 22 to memory 20. A program for generating a netlist model for the circuit is input to memory 20 from storage medium 21. CPU 18 runs the program and outputs the netlist model to I/O devices 22, so that the netlist may be used in ATPG. The program for generating the netlist model is described below in greater detail.

Figure 3A:
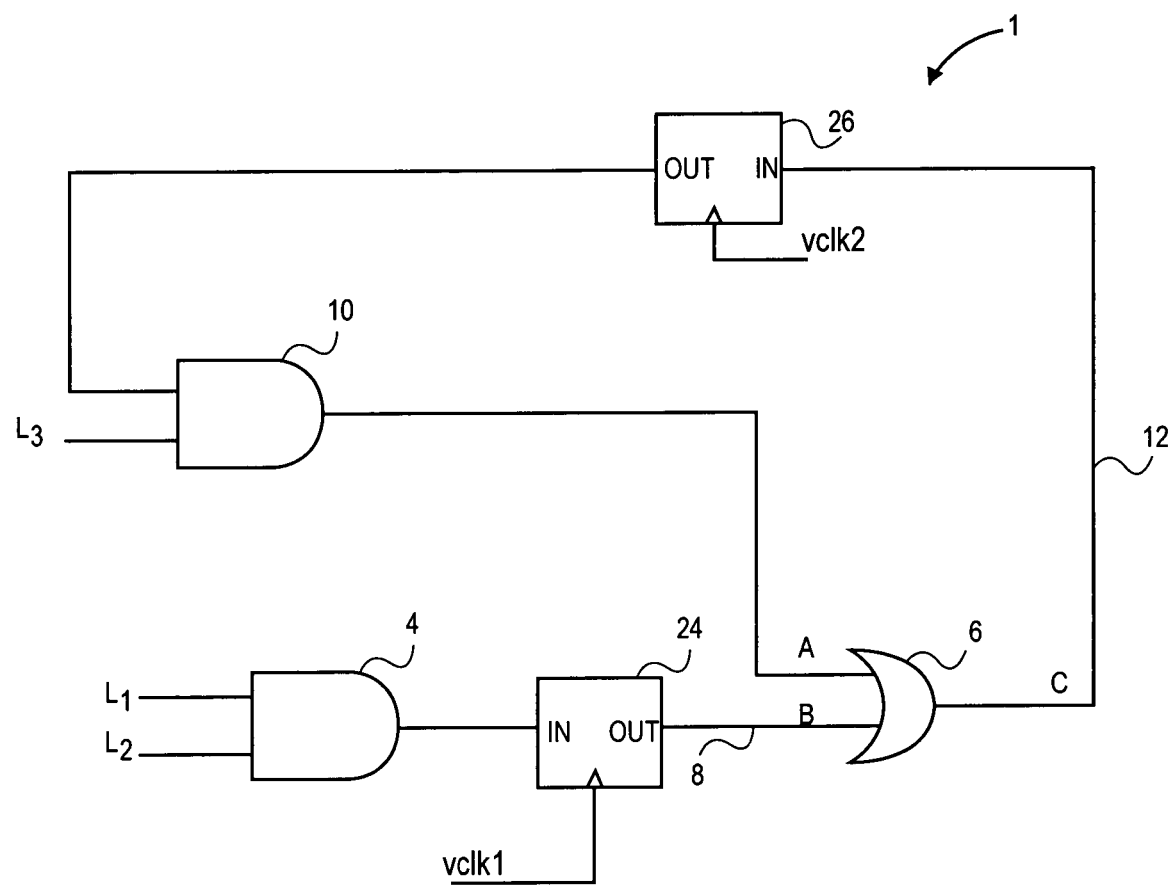
FIG. 3A is a diagram of a model digital circuit for ATPG in accordance with one embodiment of the present invention.

FIG. 3A is a diagram of a model digital circuit 1' for ATPG in accordance with one embodiment of the present invention. In addition to the elements present in the actual physical digital circuit 1, modeled digital circuit 1' further includes a virtual delay element 24 having an input coupled to a virtual clock vclk1 and a virtual delay element 26 having an input coupled to a virtual clock vclk2. Virtual delay element 24 is also coupled to the output of AND gate 4 and to the input of OR gate 6 along first conductive path 8. Virtual delay element 26 is coupled to the input of AND gate 10 and the output of OR gate 6 along second conductive path 12.

Through virtual delay elements 24 and 26, a user may impose a specific race resolution through virtual clocks that have timing characteristics that are controlled as virtual primary inputs. For example, if in digital circuit 1, data traveling on second conductive path 12 takes a long time relative to data traveling on first conductive path 8, then a rising edge of vclk2 may be set at a later time than a rising edge of vclk1 to resolve the race. It is in this manner that a user may impose an order as to which set of data arrives at the inputs of OR gate 6 first. The sequential ATPG tool can then obtain the appropriate test vectors while satisfying the virtual clock constraints provided by the user. By using model digital circuit 1' as a model for a netlist, ATPG may successfully generate valid test patterns for digital circuit 1.

Figure 1:
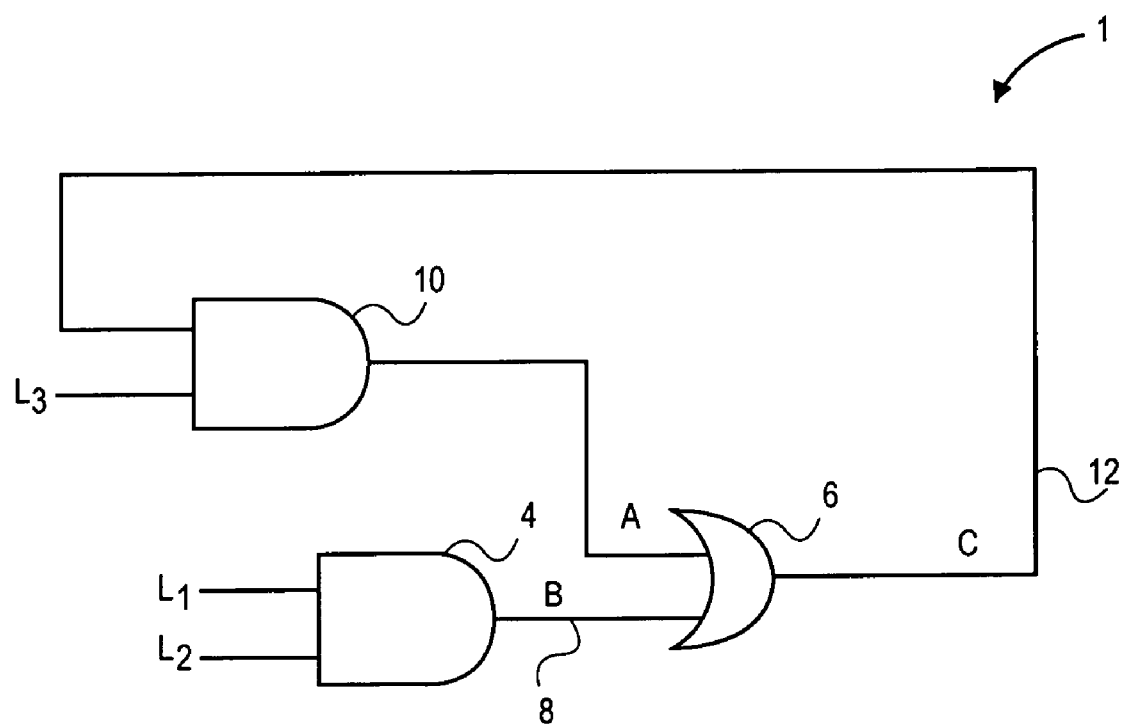
FIG. 1 is a logic gate level diagram of a digital circuit with a feedback loop and a logic gate level netlist model representing the digital circuit.
Figure 1:
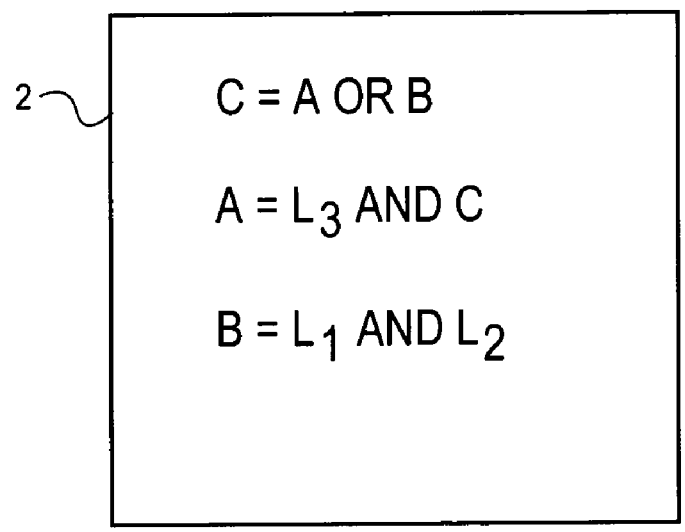

FIG. 3B illustrates a logic gate level netlist model 27 and a Verilog netlist 28 representing model digital circuit 1' illustrated in FIG. 3A. Netlist model 2 of digital circuit 1 from FIG. 1 is incorporated into netlist model 27. Netlist model 27 also includes virtual delay elements 24 and 26, which are described as flip-flops that latch the values at inputs $in_{24}$ and $in_{26}$ to outputs $out_{24}$ and $out_{26}$ when vclk1 and vclk2 are high. In Verilog netlist 28, vclk1 and vclk2 are designated as a type of wire and implicitly used as control points for an ATPG tool. This is equivalent to declaring them as and using them as primary inputs.

Figure 4:
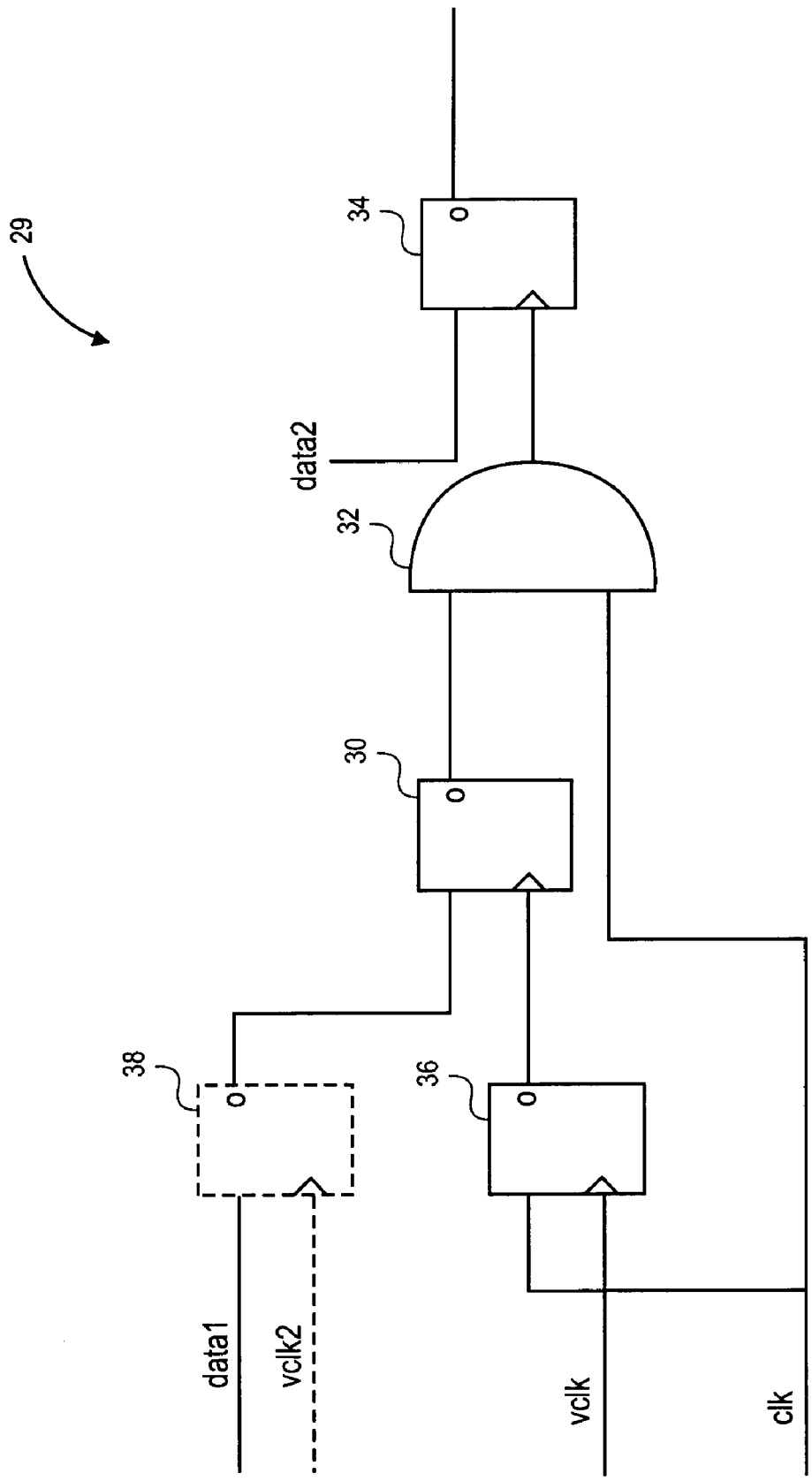
FIG. 4 is a diagram of a model sequential circuit with race resolution in accordance with one embodiment of the present invention.

FIG. 4 is a diagram of a model sequential circuit 29 with race resolution in accordance with one embodiment of the present invention. The "real" elements of model sequential circuit 29 include a flip-flop 30 with a clock clk input and a data1 input. The output of flip-flop 30 is coupled to the input of an AND gate 32. Another input of AND gate 32 is coupled to the clk. The output of AND gate 32 is coupled to the clock input of a flip-flop 34, which has a data2 input. Model sequential circuit 29 also includes a virtual delay element 36 coupled between the clock source and the clock input of flip-flop 30. Virtual delay element 36 has a clock input, which is coupled to a virtual clock vclk.

If an updated value of data1 is different than the old value of data1, then the output of flip-flop 30 will be different depending on whether the updated data1 signal or the rising edge of the clk pulse wins the race to the input of flip-flop 30. In the following example, the clock-to-output delay of flip-flop 30 is less than the delay of AND gate 32 and the old value of data1 is "1" and an updated value of data1 is "0". If the rising edge of the clk pulse wins the race, then flip-flop 30 will continue to latch the old value "1", which propagates to AND gate 32. AND gate 32 will then evaluate to a "1" and allow data2 to be latched in flip-flop 34. If the "1" value on the clock input of flip-flop 30 arrives after the new "0" value on data1, then flip-flop 30 will latch "0" to AND gate 32, which outputs a "0" disabling flip-flop 34.

Because ATPG assumes an arbitrary winner of the race, it will not generate a successful test pattern that reflects the actual operation of sequential circuit 29. Therefore, the addition of virtual delay element 36 in a netlist model is used to resolve the race between the data and clock inputs of flip-flop 30 for ATPG. Virtual delay element 36 may be used to delay the rising edge of clk from reaching flip-flop 30 until vclk is asserted to impose a specific race resolution. The relationship between vclk and the other components of model sequential circuit 29 may be specified by the user depending on the exact delay characteristics of the physical circuit. The actual vclk pulse may be asserted by the user or it may be generated by ATPG.

According to an embodiment of the present invention, race resolution at every sequential element can be individually controlled by the introduction of virtual delay elements controlled by corresponding virtual clocks in the appropriate path. Therefore, each sequential element can have its own race resolution mechanism. For example in sequential circuit 29, if control over the arrival time of data1 is required by ATPG, then a virtual delay element 38 may be added along the path of the data1 input to flip-flop 30.

Figure 5:
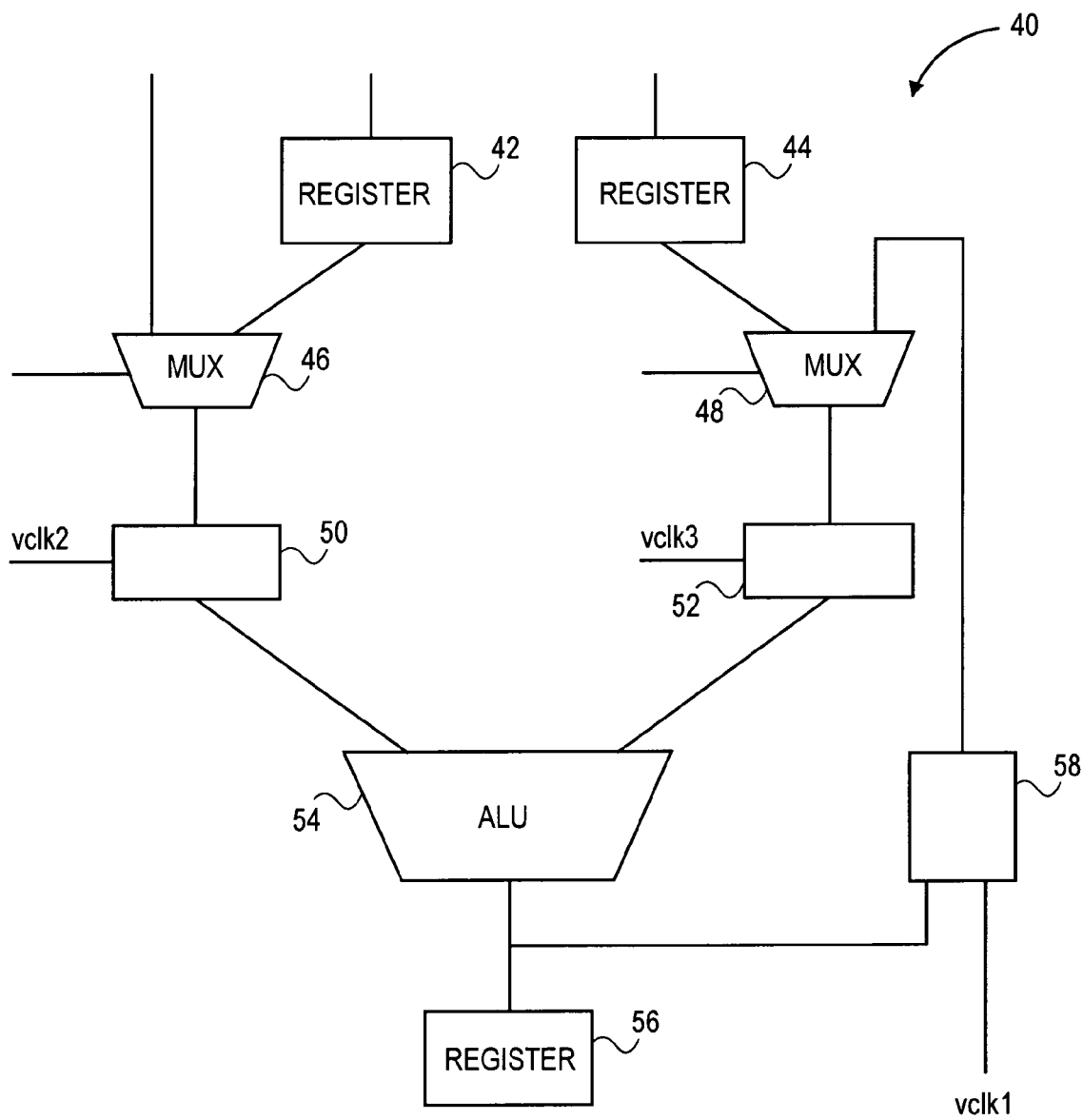
FIG. 5 is a diagram of a model bypass circuit having delay sensitive combinational feedback loops with race resolution in accordance with one embodiment of the present invention.

FIG. 5 is a diagram of a model bypass circuit 40 having delay sensitive combinational feedback loops with race resolution in accordance with one embodiment of the present invention. Model bypass circuit 40 includes a pair of registers 42 and 44, which output to a corresponding pair of multiplexers (MUX) 46 and 48. Multiplexers 46 and 48 have outputs that are coupled to a pair of virtual delay elements 50 and 52. Virtual delay elements 50 and 52 are enabled by virtual clocks vclk2 and vclk3 to output data to an arithmetic logic unit (ALU) 54. ALU 54 performs an arithmetic operation on the data and outputs the data to a register 56. The circuit includes a virtual delay element 58 enabled by vclk1. Virtual delay element 58 then completes a feedback loop by outputting data to multiplexer 48.

Model bypass circuit 40 is an example of an asynchronous circuit where time borrowing occurs and virtual delay elements 50, 52, and 58 are required to model a netlist for ATPG. If for example, ALU 54 is attempting to perform an adding operation such as: sum=A+B+C, then the operation may be broken up into two separate operations represented by: sum1=A+B and sum2=sum1+C. The intermediate result (sum1) may be sent directly to multiplexer 48 without being stored by register 56. Therefore, one part of the feedback loop in model bypass circuit 40 will be borrowing time from another part to generate the end result. If virtual delay elements 50, 52, and 58 are not present in the netlist, then ATPG will not take time borrowing and min-delay in the bypass loop into account, and the test pattern generated will not function properly.

Figure 6:
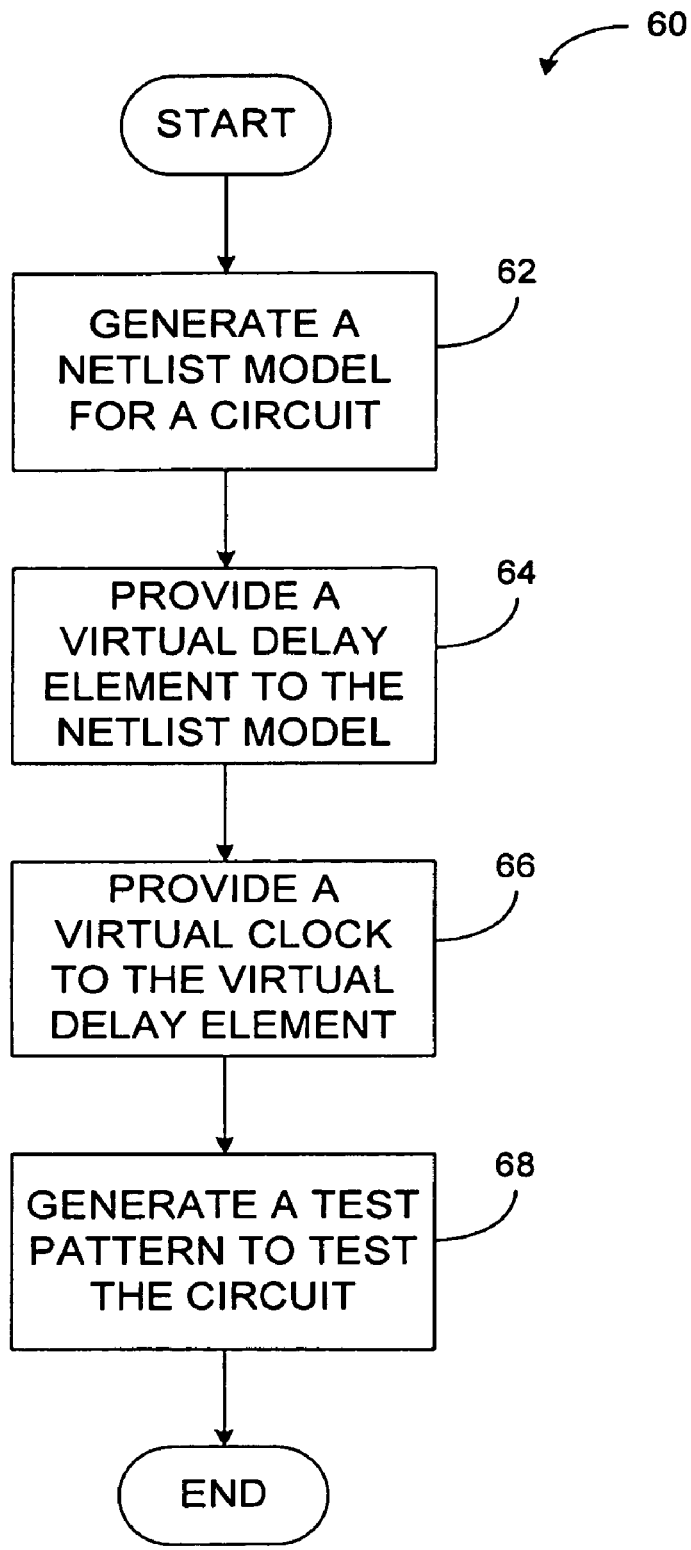
FIG. 6 is a flowchart of a method for generating a model for a circuit in accordance with one embodiment of the present invention.

FIG. 6 is a flowchart of a method 60 for generating a model for a circuit in accordance with one embodiment of the present invention. Method 60 begins at a block 62, in which a netlist model is generated for the circuit. The netlist model is a logic gate level description of the circuit that is used by ATPG to generate test patterns that are applied to the actual circuit to test for defects (e.g. at block 68). In a block 64, a virtual delay element is provided to the netlist model. The virtual delay element is coupled to an asynchronous circuit element (or a combination of circuit elements that demonstrate asynchronous behavior) and provided along paths where race resolution is required. By controlling a virtual clock that enables the virtual delay element (e.g. at block 66), either the user or ATPG may impose an order in which signals arrive at any component in the circuit.

An advantage of the present invention is that it allows for race resolution in an ATPG system for circuits that exhibit asynchronous behavior. The ATPG system will then be able to generate valid test patterns to test the circuits for defects. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A computer implemented method, comprising:
generating a netlist model for a circuit;
providing a first virtual delay element in the netlist model;
providing a first virtual clock signal to the first virtual delay element to influence a desired race resolution for the circuit;
providing a second virtual delay element in the netlist model;
providing a second virtual clock signal to the second virtual delay element, wherein the second virtual clock signal has different timing as compared to the first virtual clock signal; and
generating a test pattern to test the circuit in accordance with the first and second virtual clock signals for the first and second virtual delay elements.

2. The method as recited in claim 1, further comprising:
selectively providing a virtual delay element for respective sequential elements in the circuit in accordance with respective race resolution requirements of the respective sequential elements.

3. The method of claim 1, wherein the virtual clock signal is identified as a primary input of an automatic test pattern generation (ATPG) system.

4. The method of claim 3, wherein the virtual clock signal is specified by a user of the ATPG system in accordance with a physical characteristic of the circuit.

5. The method of claim 4, wherein the physical characteristic comprises a delay characteristic.

6. The method of claim 5, wherein the delay characteristic corresponds to a length of conductive paths between circuit elements.

7. A system, comprising:
a processor; and
a memory coupled to the processor, the memory storing a program adapted to:
generate a netlist model for a circuit;
provide a first virtual delay element in the netlist model;
provide a first virtual clock signal to the first virtual delay element to influence a desired race resolution for the circuit;
provide a second virtual delay element in the netlist model;
provide a second virtual clock signal to the second virtual delay element, wherein the second virtual clock signal has different timing as compared to the first virtual clock signal; and
generate a test pattern to test the circuit in accordance with the first and second virtual clock signals for the first and second virtual delay elements.

8. The system as recited in claim 7, wherein the program is further adapted to selectively provide a virtual delay element for respective sequential elements in the circuit in accordance with respective race resolution requirements of the respective sequential elements.

9. The system of claim 7, wherein the virtual clock signal is identified as a primary input of an automatic test pattern generation (ATPG) system.

10. The system of claim 9, wherein the virtual clock signal is specified by a user of the ATPG system in accordance with a physical characteristic of the circuit.

11. The system of claim 10, wherein the physical characteristic comprises a delay characteristic.

12. The system of claim 11, wherein the delay characteristic corresponds to a length of conductive paths between circuit elements.

13. A set of instructions residing in a computer readable storage medium, the set of instructions when executed by a processor implement a method, the method comprising:
generating a netlist model for a circuit;
providing a first virtual delay element in the netlist model;
providing a first virtual clock signal to the first virtual delay element to influence a desired race resolution for the circuit;
providing a second virtual delay element in the netlist model;
providing a second virtual clock signal to the second virtual delay element, wherein the second virtual clock signal has different timing as compared to the first virtual clock signal; and
generating a test pattern to test the circuit in accordance with the first and second virtual clock signals for the first and second virtual delay elements.

14. The set of instructions as recited in claim 13, wherein the method further comprises:
selectively providing a virtual delay element for respective sequential elements in the circuit in accordance with respective race resolution requirements of the respective sequential elements.

15. The set of instructions of claim 13, wherein the virtual clock signal is identified as a primary input of an automatic test pattern generation (ATPG) system.

16. The set of instructions of claim 15, wherein the virtual clock signal is specified by a user of the ATPG system in accordance with a physical characteristic of the circuit.

17. The set of instructions of claim 16, wherein the physical characteristic comprises a delay characteristic.

18. The set of instructions of claim 17, wherein the delay characteristic corresponds to a length of conductive paths between circuit elements.

* * * * *